(12) United States Patent
Ho et al.

(10) Patent No.: US 8,986,782 B2
(45) Date of Patent: Mar. 24, 2015

(54) METHOD OF FORMING SELF-ASSEMBLY AND UNIFORM FULLERENE ARRAY ON SURFACE OF SUBSTRATE

(76) Inventors: Mon-Shu Ho, Taichung (TW);
Chih-Pong Huang, Taichung (TW)

( * ) Notice: Subject to any disclaimer, the term of this patent is extended or adjusted under 35 U.S.C. 154(b) by 354 days.

(21) Appl. No.: 12/386,915

(22) Filed: Apr. 24, 2009

(65) Prior Publication Data
US 2010/0272985 A1    Oct. 28, 2010

(51) Int. Cl.
| | |
|---|---|
| B32B 5/16 | (2006.01) |
| C23C 16/00 | (2006.01) |
| C23C 14/34 | (2006.01) |
| C23C 14/02 | (2006.01) |
| B82Y 30/00 | (2011.01) |
| B82Y 40/00 | (2011.01) |
| C01B 31/02 | (2006.01) |
| C23C 14/06 | (2006.01) |
| H01J 1/304 | (2006.01) |
| H01J 9/02 | (2006.01) |

(52) U.S. Cl.
CPC .............. *C23C 14/021* (2013.01); *B82Y 30/00* (2013.01); *B82Y 40/00* (2013.01); *C01B 31/0206* (2013.01); *C23C 14/0605* (2013.01); *H01J 1/304* (2013.01); *H01J 9/025* (2013.01); H01J 2201/30465 (2013.01); H01J 2201/30469 (2013.01); *H01J 2329/0452* (2013.01); *H01J 2329/0455* (2013.01)
USPC ......... 427/248.1; 427/122; 428/323; 428/408

(58) Field of Classification Search
CPC .... B82Y 30/00; B82Y 40/00; C01B 31/0206; C23C 14/021; C23C 14/0605; H01J 2329/0455; H01J 9/025; H01J 2201/30465; H01J 2201/30469; H01J 2329/0452; H01J 1/304
USPC ........... 427/248.1, 122, 903, 249.1; 428/323, 428/833.2, 408; 977/752, 734, 750; 204/192.15
See application file for complete search history.

(56) References Cited

U.S. PATENT DOCUMENTS 5,558,903 A * 9/1996 Bhushan et al. ................ 427/11
6,479,111 B2 * 11/2002 Dykes et al. ................... 427/595

(Continued)

FOREIGN PATENT DOCUMENTS

| CN | 101150088 A | 3/2008 |
|---|---|---|
| JP | 2004-263241 A | 9/2004 |
| TW | 200826136 | 6/2008 |

OTHER PUBLICATIONS

Su et al., The Journal of Physical Chemistry B, vol. 104, No. 28, Jul. 20, 2000.*

*Primary Examiner* — Roy King
*Assistant Examiner* — Michael Aboagye
(74) *Attorney, Agent, or Firm* — Seyfarth Shaw LLP

(57) ABSTRACT

The present invention provides a method of forming a self-assembly fullerene array on the surface of a substrate, comprising the following steps:
(1) providing a substrate;
(2) pre-annealing the substrate at a temperature ranging from 200° C. to 1200° C. in a vacuum system; and
(3) providing powdered fullerene nanoparticles and depositing them on the surface of the substrate by means of physical vapor deposition technology in the vacuum system, so as to form a self-assembly fullerene array on the surface of the substrate.

The present invention also provides a fullerene embedded substrate prepared therefrom, which has excellent field emission properties and can be used as a field emitter for any field emission displays.

Finally, the present invention provides a fullerene embedded substrate prepared therefrom, which can be used to substitute for semiconductor carbides as optoelectronic devices and high-temperature, high-power, or high-frequency electric devices.

10 Claims, 9 Drawing Sheets

(56) References Cited

U.S. PATENT DOCUMENTS

| | | | |
|---|---|---|---|
| 6,586,069 B2* | 7/2003 | Dykes et al. | 428/833.2 |
| 6,743,481 B2* | 6/2004 | Hoehn et al. | 427/384 |
| 7,384,668 B2* | 6/2008 | Mauthner et al. | 427/249.1 |
| 7,800,194 B2* | 9/2010 | Freedman | 257/461 |
| 2004/0241896 A1* | 12/2004 | Zhou et al. | 438/48 |
| 2005/0032268 A1* | 2/2005 | Nishikawa et al. | 438/99 |
| 2009/0047427 A1* | 2/2009 | Das et al. | 427/248.1 |
| 2010/0212283 A1* | 8/2010 | Yousefiani | 60/200.1 |

* cited by examiner

METHOD OF FORMING SELF-ASSEMBLY AND UNIFORM FULLERENE ARRAY ON SURFACE OF SUBSTRATE

FIELD OF THE INVENTION

The present invention relates to a method of forming a self-assembly fullerene array on the surface of a substrate. In particular, the present invention relates to a novel method of preparing a fullerene embedded substrate capable of being used as a field emitter, and a substrate for optoelectronic devices, and high-temperature, high-power, or high-frequency electric devices.

DESCRIPTION OF THE PRIOR ART

Before 1985, only two types of carbon element were known, namely, two-dimensional graphite and three-dimensional diamond. In an experiment for studying the physical properties of interstellar dust, Kroto and Smally used strongly focused laser to generate heat of 10,000 degrees Celsius to evaporate graphite, so as to get straight-chain molecules which only contained carbon for simulating polymers of pure interstellar carbon molecules. A novel compound with a very high yield and a very stable structure of an icosidodecahedron with a diameter of about 7.1 Å was found. In the compound, 20 faces were hexagon, 12 faces were pentagon, and the faces were not connected with each other, which met the isolated pentagons rule (IPR), and 60 vertexes were occupied by 60 carbon atoms. In 1985, Kroto and Smally set forth that the structure of carbon-60 molecule was like the football structure of the dome designed by American architect Buckminster Fuller, and thus, the carbon-60 ball was named Buckminster-fullerene and referred to as Buckyball or fullerene.

Since then, pure carbon molecules similar to carbon-60, such as carbon-70 or carbon-84, or fullerenes consisting of more carbon atoms and having an oval or long shape have been found. The smallest fullerene is carbon-20, and the largest fullerene is carbon nanotubes (CNTs) or carbon-1500. The fullerene with the smallest size and the most stable structure found so far is carbon-30, which consists of 6 pentagons and 5 hexagons. One pentagon in the center is surrounded by 5 hexagons, and the 5 peripheral pentagons are connected to hexagons and not connected to one another, which meets the IPR rule. Carbon-30 has 10 dangling bonds which are located at the 5 peripheral pentagons. As shown in FIG. 1, hexagons formed by several carbon atoms are added to the dangling bonds of carbon-30, to form a carbon-40 molecule, which is larger than carbon-30. Much larger fullerenes, such as carbon-50, even carbon nanotubes, can be formed by increasing the number of the hexagons added to the dangling bonds in the same manner.

Fullerenes have a general formula of $C_n$ (n is an even greater than 24). Generally, when n<40, the fullerene is called small fullerene; n>40, large fullerene; and n>400, giant fullerene, such as carbon nanotube. The structure of carbon nanotube is graphite rolled into a tube with the addition of two half-ball shaped fullerenes as caps. In 1991, Sumio. Iijima of NEC, Japan, found multi-wall carbon nanotubes (MWCNTs) when studying fullerenes. Subsequently, single-wall carbon nanotubes (SWCNTs) were found. It is known that single-wall carbon nanotubes have three structures: (1) armchair; (2) zigzag; and (3) helix. Depending on the width and rolling direction of graphite layers, carbon nanotubes can exhibit metal, semi-metal, or semiconductor properties.

Large fullerenes and giant fullerenes have very special characteristics, such as low density, high strength, high toughness, flexibility, large surface area, large surface curvature, high thermal conductivity, and specific conductivity, and many researches has been done to develop their potential applications in connection to, for instance, composite material, micro-electric device, flat panel display, wireless communication, fuel cell, and lithium ion cell. For example, as carbon nanotubes have excellent conductivity and a tip surface area close to the theoretical limit (the smaller the radius of the tip curvature, the more concentrated the local electric field), they are the best field emission material known, have extremely low field emission turn-on voltage, and is capable of transmitting high current density and keeping the current extremely stable; thus, they are very suitable for electric field emitter of field emission display (FED).

Carbon nanotube field emission display (referred to as CNT-FED) maintains the image quality of the conventional cathode-ray tube display while it consumes less power and is thinner and lighter. Due to the low turn-on electric field, high emission current density, and high stability of carbon nanotubes, CNT-FED has the advantages of low driving voltage, high luminous efficiency, no view angle problem, low power consumption, larger size at lower cost, and so on.

Presently, two methods are employed to manufacture carbon nanotube field emitter. The first method involves printing a conductive slurry or organic binder containing carbon nanotubes on a substrate into patterns by coating, and making the carbon nanotubes into emitter by emerging from the slurry through subsequent processing. The second method involves directly growing carbon nanotube pattern on the substrate in a catalytic growth method.

When the first method is used, the cost is low, and large-size products can be easily manufactured, but it is difficult to control the direction of each carbon nanotube in the carbon nanotube array. The catalytic growth method usually uses chemical vapor deposition (CVD) to grow the carbon nanotube array on a semiconductor substrate to serve as the emitter. The method works as follows: first, the cathode plate is etched into pits with fixed pore size; next, metal catalyst (generally, metal iron, cobalt, and nickel) is filled into the pores by CVD; and then $C_2H_2$ is cracked at high temperature, to grow orderly carbon nanotubes along the pores, so that high-quality carbon nanotube emitter can be manufactured with the single mask and auto alignment technique developed by Prof. Milne and other scholars. However, the method is disadvantageous as the manufacture cost is high, and the ends of carbon nanotubes usually are curved and intertwined. In order to remove the coarse surface of the carbon nanotube array and form an emission tip with excellent performance, subsequent processing of the carbon nanotube array is required. Further, there are still some difficulties in manufacturing large-area and highly uniform cathode emitter by CVD.

Therefore, the industry is still making efforts to develop a process of forming fullerene emitter having orderly carbon nanotubes and suitable for large-size panel at low cost.

SUMMARY OF THE INVENTION

The present invention is directed to a method of forming a self-assembly fullerene array on the surface of a substrate, which includes:

(1) providing a substrate;
(2) pre-annealing the substrate at a temperature ranging from about 200° C. to about 1200° C. in a vacuum system; and
(3) providing powdered fullerene nanoparticles, and depositing the powdered fullerene nanoparticles on the surface of the substrate in the vacuum system by means of physical vapor deposition (PVD), so as to form a self-assembly fullerene array on the surface of the substrate.

The present invention is further directed to a fullerene embedded substrate prepared therefrom, which has excellent field emission properties and can be used as a field emitter for any field emission displays.

The present invention is further directed to a fullerene embedded substrate prepared therefrom, which can be used to substitute for semiconductor carbides as optoelectronic devices and high-temperature, high-power, or high-frequency electric devices.

DETAILED DESCRIPTION

Figure 1:
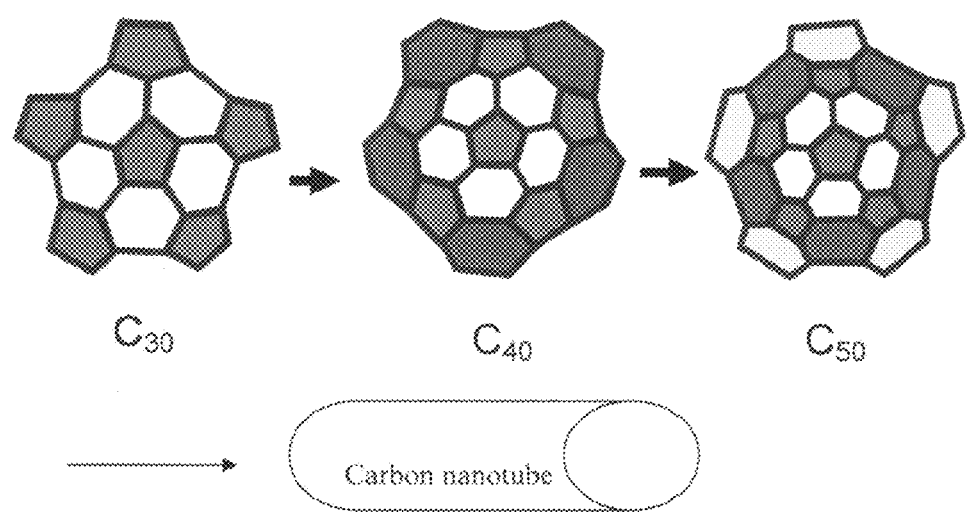
FIG. 1 is a schematic view of the growth of fullerenes.

In Step (1) of the method of the present invention, a substrate is provided for self-assembly of fullerenes thereon. The substrate is useful in the present invention includes, but is not limited to, germanium, silicon, arsenic, aluminum, boron, silicon nitride, zinc oxide, gallium nitride, boron nitride, gallium phosphide, gallium arsenide, indium arsenide, indium phosphide, sapphire, zinc sulfide, and cadmium sulfide. Silicon (100) substrate or silicon (111) substrate is preferred. N-type or p-type silicon (111) substrate is more preferred.

In Step (2) of the method of the present invention, the substrate is pre-annealed at a temperature of about 200° C. to about 1200° C. in a vacuum system, preferably at a temperature of about 400° C. to about 1000° C., and more preferably at a temperature of about 700° C. to about 900° C. Herein, the term "vacuum system" has no special definition, and means the vacuum degree is below about 1 atmospheric pressure, preferably below $1 \times 10^{-5}$ Pa, and more preferably below $1 \times 10^{-7}$ Pa, which is known by those of ordinary skill in the art.

In Step (3) of the method of the present invention, powdered fullerene nanoparticles are deposited on the surface of the substrate by means of physical vapor deposition technology in the vacuum system. Without wishing to be bound by theory, it is believed that as the substrate is pre-annealed in a vacuum system, the powdered fullerene nanoparticles can be self-assembly into a highly uniform fullerene array on the surface of the substrate. Herein, "highly uniform fullerene array" means that the fullerenes are distributed on the substrate uniformly and most of the fullerenes are vertical to the surface of the substrate and are compactly arranged. Furthermore, the vertical height of the fullerene array thus formed is substantially identical.

The physical vapor deposition technology useful in the present invention includes, but is not limited to, evaporation method, molecular beam epitaxy, and sputtering method. According to one embodiment of the present invention, the powdered fullerene nanoparticles are deposited on the surface of the substrate by using evaporation process through which they are heated and evaporated into gas in a vacuum system. The operation temperature of the evaporation is in a range of about 200° C. to about 1200° C., depending on the type of the fullerene. In principle, the more the number of the carbon atoms, the higher the operation temperature of the evaporation. Taking carbon-84 as an example, the operation temperature of the evaporation is in a range of about 550° C. to about 750° C. If carbon-120 is used as the fullerene source, the operation temperature of the evaporation is in a range of about 600° C. to about 900° C. If carbon-300 is used as the fullerene source, the operation temperature of the evaporation is in a range of about 700° C. to about 1100° C. According to another embodiment of the present invention, the powdered fullerene nanoparticles can also be deposited on the surface of the substrate by using molecular beam epitaxy in a vacuum system. Further, the powdered fullerene nanoparticles can also be compressed into a target material, and then the fullerenes are deposited on the surface of the substrate by using sputtering method in a vacuum system.

According to an implementation aspect of the present invention, between Steps (1) and (2), a step of pre-cleaning the substrate can be optionally included. The pre-cleaning step includes: cleaning the surface of the substrate with a solvent, and then heating the substrate in a vacuum system to remove the oxide layer and impurity from the surface of the substrate. The type of the solvent useful in the pre-cleaning step is known to those of ordinary skill in the art, and includes, but is not limited to, deionized water, ketones, alcohols, acids, bases, and combinations thereof.

The powdered fullerene nanoparticles useful in the present invention are commercially available. Various fullerenes that are known to those of ordinary skill in the art can be used in the method of the present invention to form a self-assembly and highly uniform array on the substrate. Suitable fullerenes include, but are not limited to, carbon-20, carbon-24, carbon-36, carbon-40, carbon-42, carbon-48, carbon-50, carbon-55, carbon-60, carbon-62, carbon-64, carbon-68, carbon-70, carbon-72, carbon-76, carbon-78, carbon-80, carbon-82, carbon-84, carbon-90, carbon-94, carbon-96, carbon-100, carbon-102, carbon-120, carbon-140, carbon-300, single-wall carbon nanotubes, double-wall carbon nanotubes, and multi-wall carbon nanotubes.

The method of the present invention is advantageous as the process is simple and the cost is low. Besides, as the fullerene array is distributed in a highly uniform manner, the structure prepared therefrom has high emission efficiency and low turn-on voltage, and is thus suitable as a field emitter in field emission display (FED). Furthermore, as the fullerenes are compactly arranged on the substrate, the structure formed is not easily attacked by hydrogen, oxygen, and nitrogen (including atoms, ions, or molecules of the elements and compounds thereof).

When a semiconductor material is used as substrate, the fullerene embedded substrate formed according to the method of the present invention is a suitable substitute for conventional semiconductor carbides.

Semiconductor carbide is one of the most important new-generation semiconductor materials, and has excellent applications in various fields due to its many excellent physical and chemical properties, such as wide energy band, high power, high temperature resistance, and high frequency. As for mechanical properties, as silicon carbide has a Mohs hardness of 9.0, which is only lower than that of diamond (10.0) and much higher than that of silicon (7.0) or gallium arsenide (about 5.0-5.5), silicon carbide can be used as reinforcing material of composite materials, abrasive material, and cutting tool, pump lining and fiber reinforcing material. As for thermal properties, as silicon carbide has a higher thermal conductivity (3-5 W/cm.K) at room temperature than silicon (1.5 W/cm.K) and gallium arsenide (0.5 W/cm.K), and a much higher melting point (2830° C.) than those of silicon (1420° C.) and gallium arsenide (1240° C.), can endure high operation temperature, and has thermal shock resistance and high-temperature oxidation resistance, silicon carbide can be used in airplane and automotive engine sensor, jet engine ignition, and turbine engine blade.

As for electrical properties, silicon carbide has a wider energy band (1.8-3.0 eV) than silicon (1.12 eV) and gallium arsenide (1.42 eV), and is capable of resisting electron penetration, so it is suitable as light-emitting material of light emitting diode (LED) [3]. Furthermore, due to high saturation electron mobility, silicon carbide can be excited to emit short-wavelength light, and thus is suitable for use in blue LED, nearly solar blind UV photodetectors, high-frequency power supply, and phased array radar system. Silicon carbide has a much higher breakdown voltage ($2.2-4\times10^6$ V/cm) than those of silicon ($2.5\times10^5$ V/cm) and gallium arsenide ($3\times10^5$ V/cm), and can be used in integrated circuit of high device packing density. Furthermore, the high power and high dielectric constant of silicon carbide improves conversion of power and reduces energy consumption, so it is useful in Schottky diodes, metal-oxide-semiconductor field-effect transistor (MOSFET), high-frequency MESFET device, junction field effect transistor (JFET), bipolar junction transistor (BJT), PiN diodes, insulated gate bipolar transistor (IGBT), high-power and high-voltage rectifier, and film of solar cells, and has promising development potential in the applications related to optoelectronic devices and high-temperature electric devices.

However, the conventional semiconductor carbides have disadvantages such as complex preparation process, and high resistance and poor thermal conductivity due to defects on the surface of the substrate, which result in poor performance of the devices prepared therefrom.

The fullerene embedded substrate formed according to the method of the present invention not only has the advantages of conventional semiconductor carbides (such as high energy bandgap and high breakdown voltage), but also can avoid the pore effect of conventional semiconductor carbide products, and thus is a suitable substitute for semiconductor carbide in optoelectronic devices and high-temperature, high-power, or high-frequency electric devices.

The following embodiment is intended to further illustrate the present invention, but not to limit the scope of present invention. Any alternations and modifications that can be easily achieved by those of ordinary skill in the art fall within the scope of the disclosure of the specification and the accompanying claims.

Embodiment (1) An n-type silicon (111) substrate was provided.

(2) The silicon substrate was washed with an ultrasonic cleaner in deionized water, acetone, and methanol solutions in sequence.

(3) The silicon substrate was slowly heated to about 600° C. in an ultra-high vacuum chamber (about $1\times10^{-8}$ Pa), and remained at this temperature for 6-12 h. Next, the silicon substrate was slowly heated to about 1250° C., remained for 10 seconds to 5 minutes, and then cooled down to room temperature, so as to remove the oxide layer and impurity from the surface. The whole process was performed in the ultra-high vacuum chamber.

(4) The silicon substrate was slowly heated to about 700° C. to about 900° C. in the ultra-high vacuum chamber and remained at this temperature.

Figure 2:
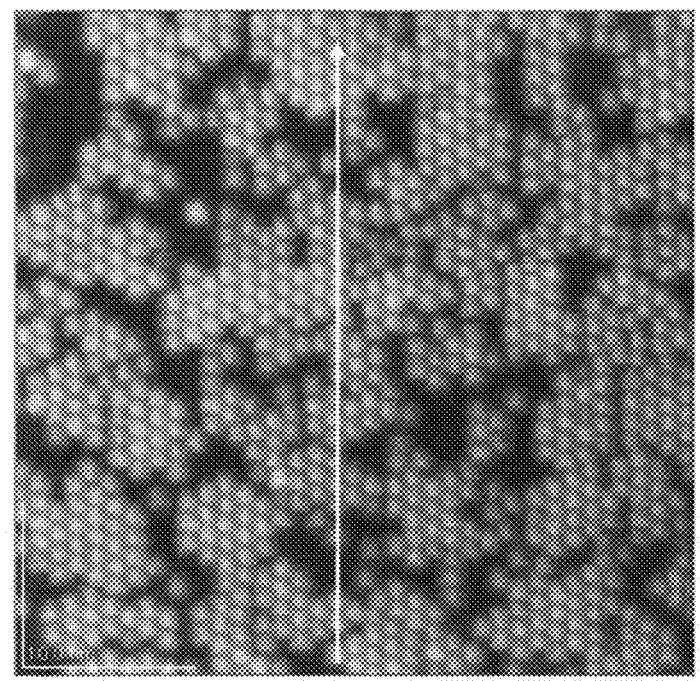
FIGS. 2 and 3 are images (40×40 nm$^2$) of carbon-84 array prepared according to an embodiment of the present invention taken by a scanning tunneling microscope (STM) and the corresponding profiles thereof.
Figure 2:
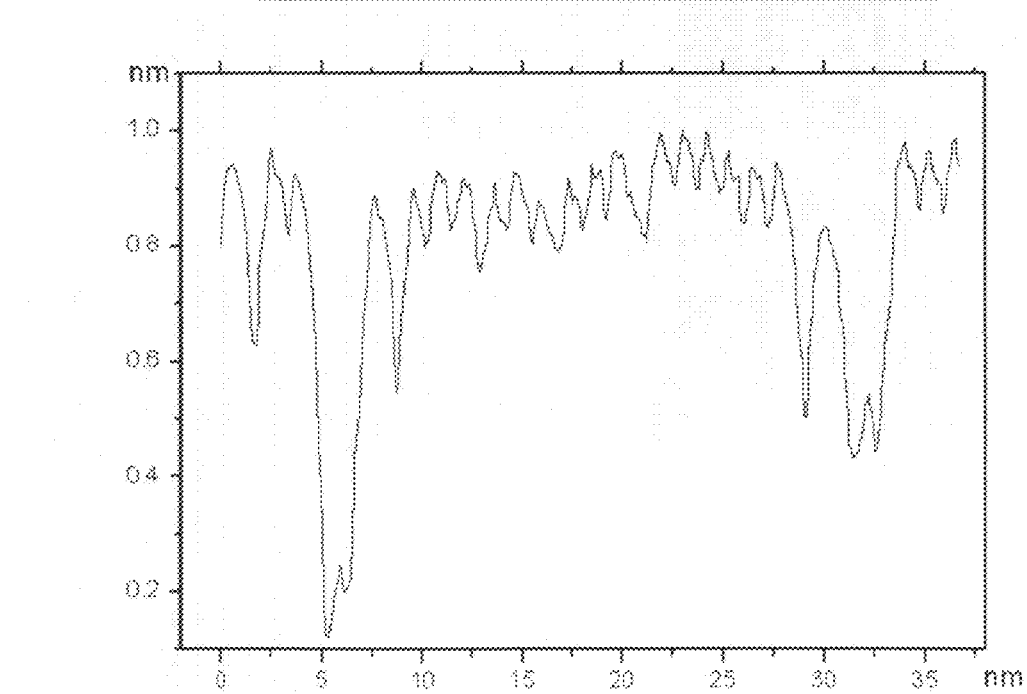
Figure 3:
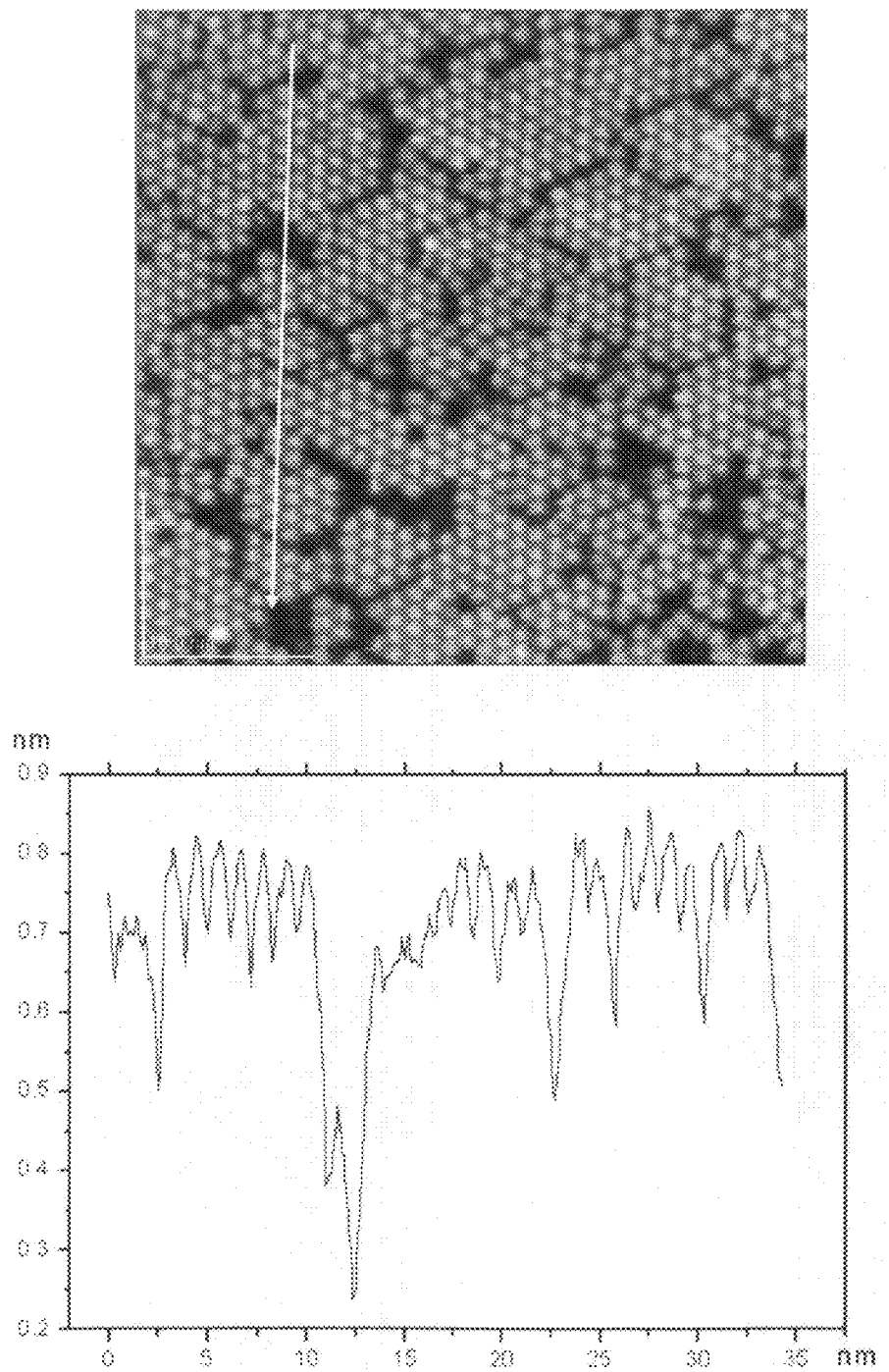
Figure 4:
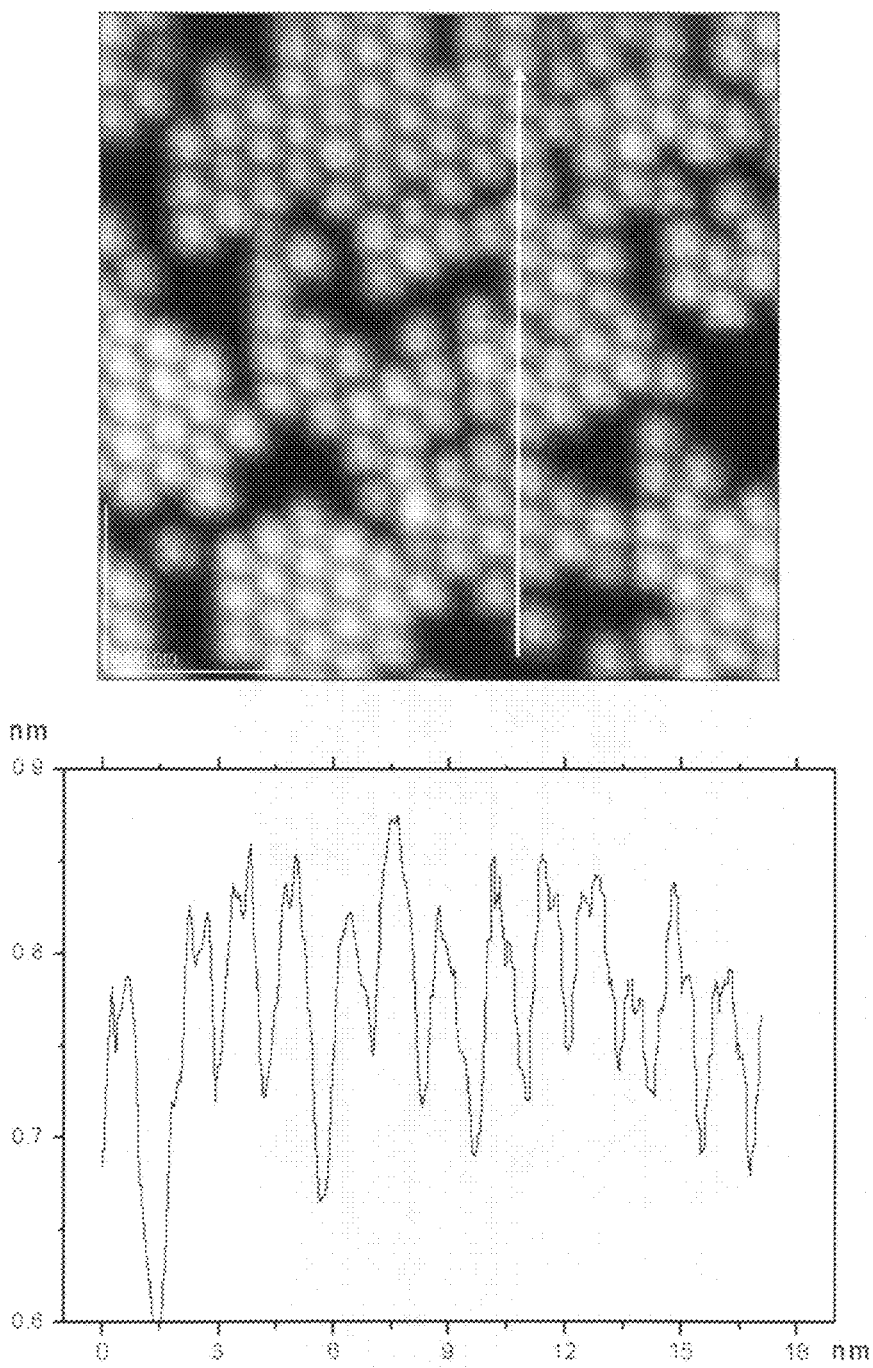
FIG. 4 is an image (20×20 nm$^2$) of carbon-84 array prepared according to the embodiment of the present invention taken by STM and the corresponding profile thereof.
Figure 5:
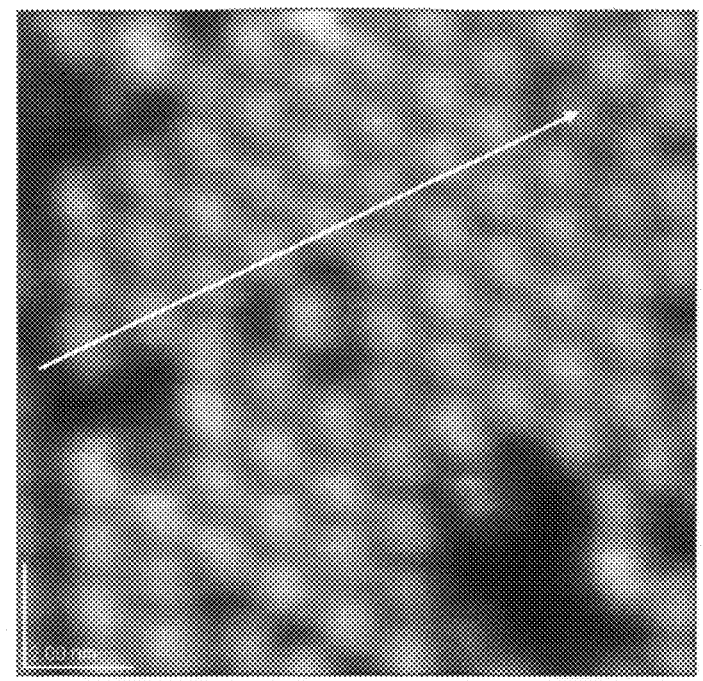
FIG. 5 is an images (12.5×12.5 nm$^2$) of carbon-84 array prepared according to the embodiment of the present invention taken by STM and the corresponding profile thereof.
Figure 5:
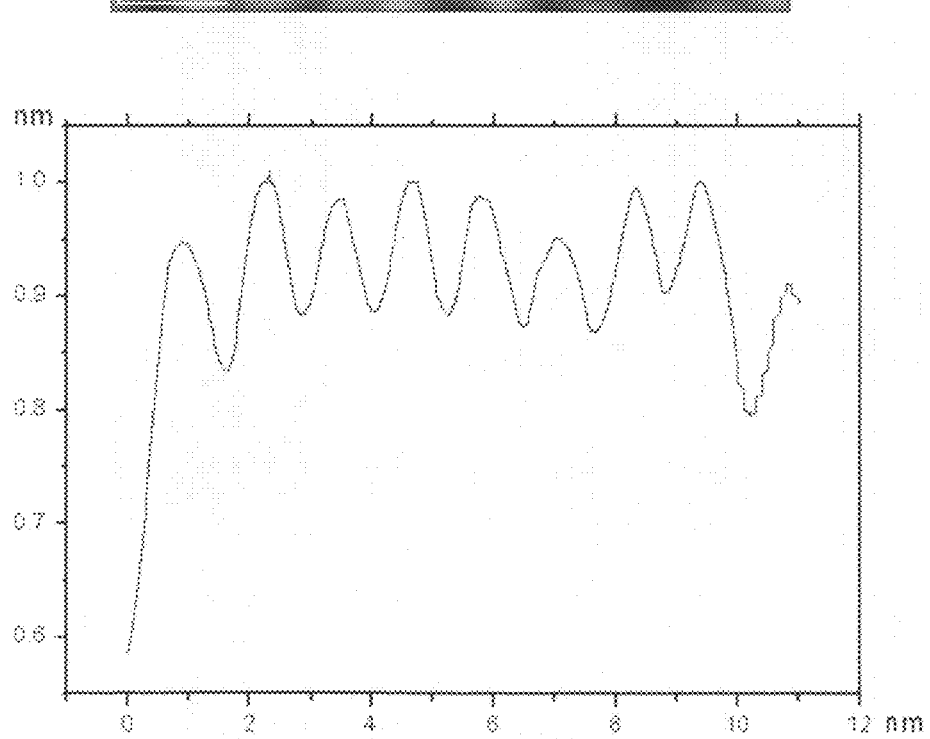

(5) The commercially available carbon-84 nano-powders (Aldrich Chem. Co.) with a purity of 98% were heated to about 550° C. to about 750° C. with a thermal evaporator (Vacweld Miniature K-Cell) in ultra-high vacuum chamber. Next, the carbon-84 nano-powders were vertically evaporated on the surface of the silicon substrate at a distance of 4-10 cm from the silicon substrate within 1-40 minutes, so that carbon-84 was self-assembly on the surface of the substrate to form a highly uniform array, as shown in FIG. 2.

Testing Method and Result (1) Assessment of Distribution Uniformity

Three-dimensional analysis was performed on the carbon-84 array prepared according to the embodiment with a scanning tunneling microscope (STM), and the result is shown in FIGS. 2 to 5. STM images show that carbon-84 is highly uniformly distributed on the silicon substrate. Further, the corresponding profile also show that most of carbon-84 are vertical to the surface of the silicon substrate and are compactly arranged, and the vertical height of formed carbon-84 array is substantially identical.

Furthermore, as carbon-84 is compactly arranged on the silicon substrate, the formed silicon carbide substrate is not easily attacked by hydrogen, oxygen, and nitrogen (including atoms, ions, or molecules of the elements and compounds thereof).

(2) Assessment of Emission Property

Turn-on Voltage

Figure 6:
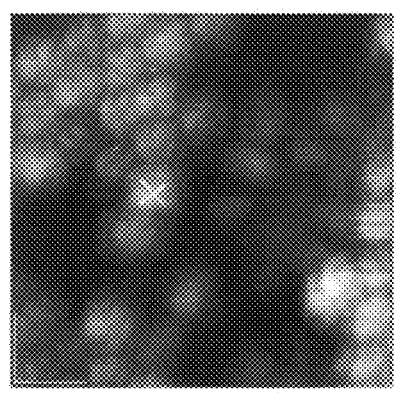
FIG. 6 is a current-voltage characteristic diagram obtained by measuring the carbon-84 array prepared according to the embodiment of the present invention with STM in vacuum.
Figure 6:
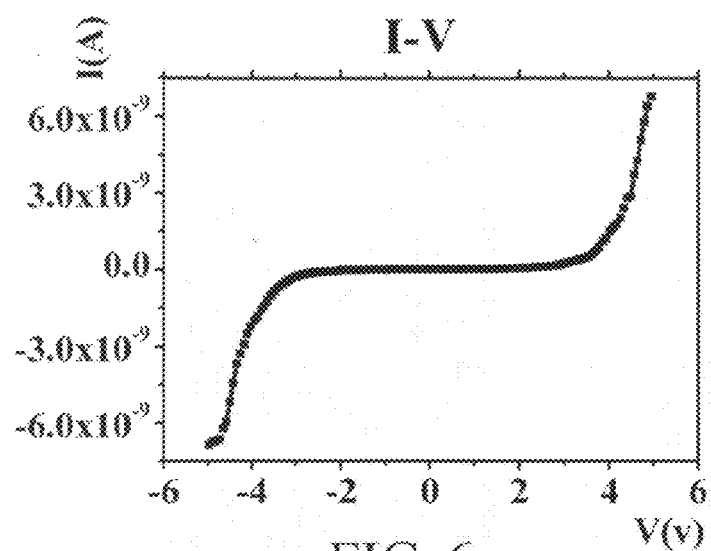
Figure 7:
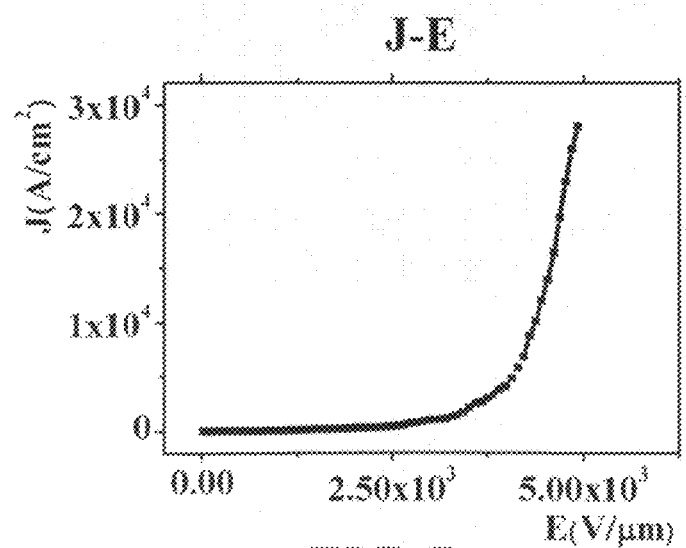
FIG. 7 is a field emission current density versus electric field curve of the carbon-84 array prepared according to the embodiment of the present invention measured by STM in vacuum, in which the turn-on current density and turn-on electric field are 100 A/cm$^2$ and 1422 V/µm, respectively.

The I-V curve of the carbon-84 array prepared according to the embodiment was measured with STM, and the result is shown in FIG. 6. The curve in the figure shows the measurement values on the white X dot. It can be seen from FIG. 6 that the turn-on voltage is merely about 1.36 V.

Field Emission Efficiency

According to quantum theory of field emission, in the absence of an external electric field, electrons in a conductor must have enough energy to tunnel the potential barrier and reach the vacuum side on the other end. However, when the space scope extended by the potential barrier is narrow, and the shape of the potential barrier is modified by adding a small electric field, a part of the electrons can be driven to tunnel the potential barrier and appear at the other end of the potential barrier. As the intensity of the electric field directly affects the field emission current, the electric field is increased with the increase of the operation voltage of the device, and at this time, the potential barrier is reduced, so the obtained emission current is increased, but this does not meet the requirement for low-voltage in the industry. If an object is made to be tip shape-like, and a high electric field is at the tip, a low turn-on electric field ($E_{on}$) and a high turn-on electric current density ($J_{on}$) can be achieved. According to Fowler-Nordheim theory, the electric field and the electric current density are plotted on a $\ln(J/E^2)$-$1/E$ plot (i.e., F-N plot). If the slope has a linear relationship, it can be used to determine whether it is a field emission electron. Furthermore, by calculating the field enhancement factor $\beta$, the field emission efficiency can be evaluated.

As can be seen from the field emission current density versus electric field curve and F-N characteristic plots of the field emission from FIGS. 7 to 12, the carbon-84 array prepared according to the embodiment of the present invention has excellent field emission efficiency.

(3) Assessment of Energy Bandgap

Figure 13:
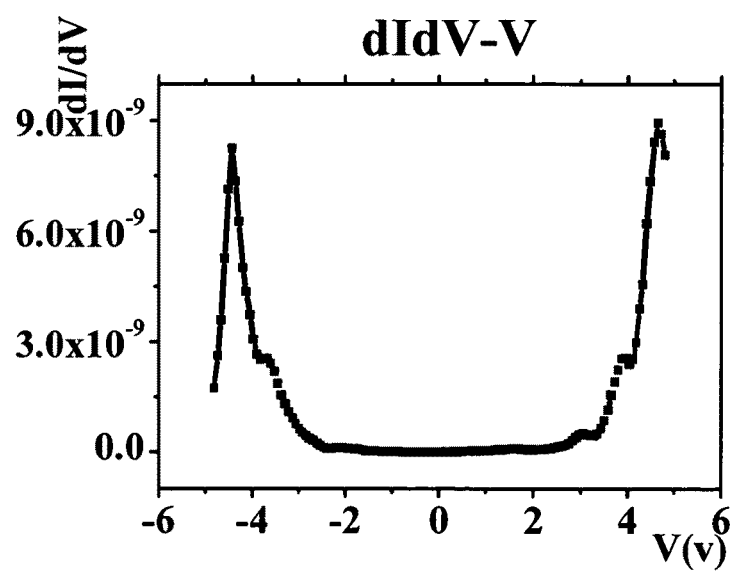
FIG. 13 is a typical differential conductance (dI/dV) versus bias voltage(v) curve of the carbon-84 array prepared according to the embodiment of the present invention measured by STM in vacuum, in which the energy bandgap is approximately 3.09 eV.

The measured current-voltage characteristic curve was converted into the typical differential conductance (dI/dV) versus bias voltage(v) curve in FIG. 13, and the energy bandgap was measured to be about 3.09 eV. It shows that the carbon-84 array prepared according to the embodiment of the present invention indeed has excellent wide energy bandgap property.

(4) Assessment of Breakdown Voltage

Figure 8:
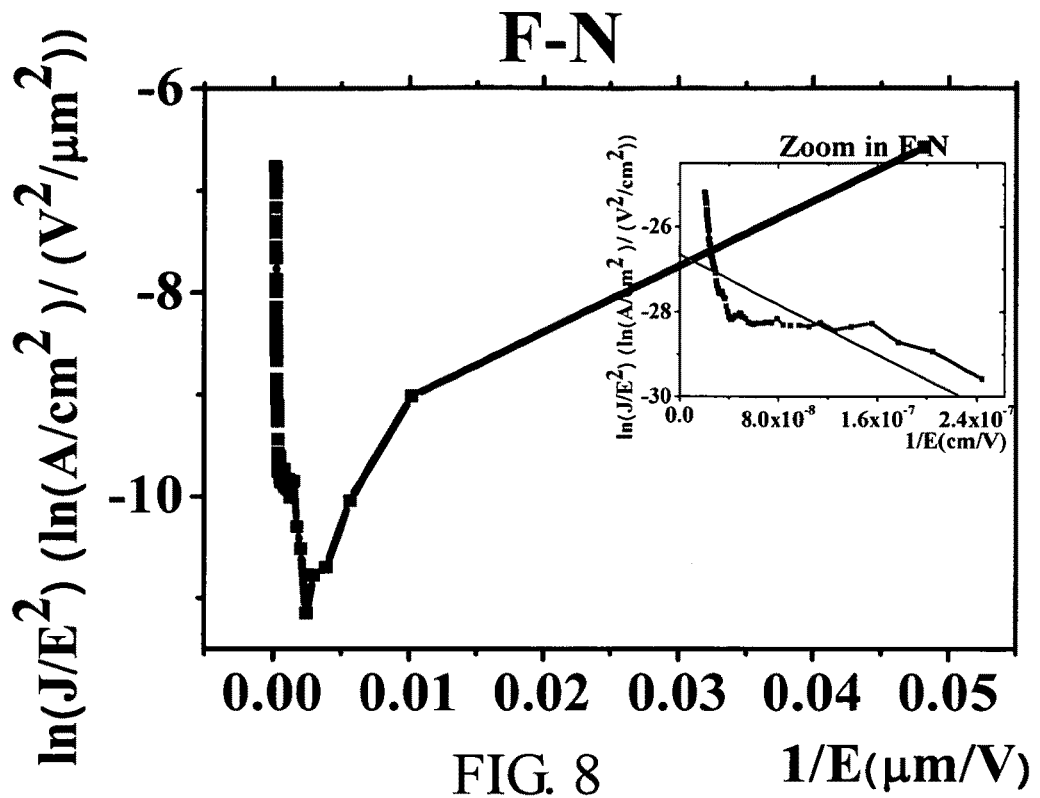
FIG. 8 is an F-N characteristic plot of the field emission of the carbon-84 array prepared according to the embodiment of the present invention measured by STM in vacuum, in which the field enhancement factor $\beta$ is approximately 51.9, and the breakdown voltage is approximately $4.1 \times 10^6$ V/cm.
Figure 9:
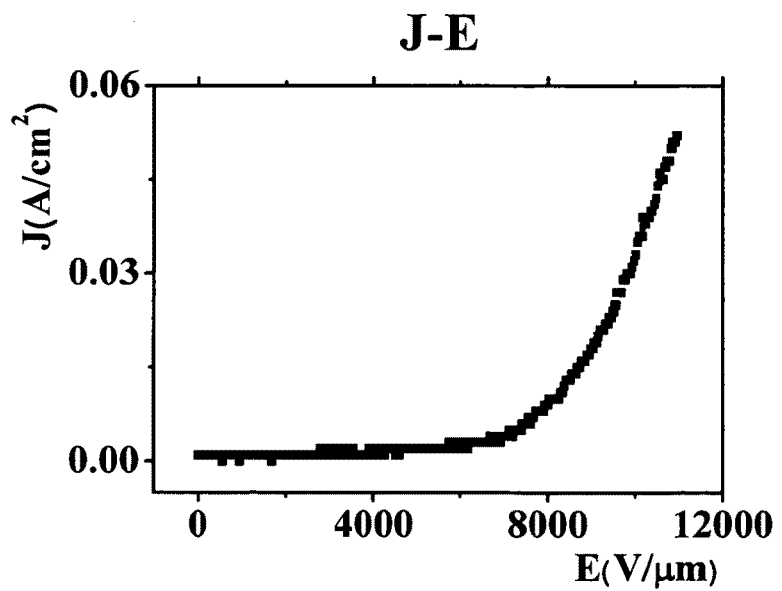
FIG. 9 is a field emission current density versus electric field curve of the carbon-84 array prepared according to the embodiment of the present invention measured by atom force microscope (AFM) at 1 atmospheric pressure, in which the turn-on current density and turn-on electric field are 0.01 A/cm$^2$ and 8035 V/µm, respectively.
Figure 10:
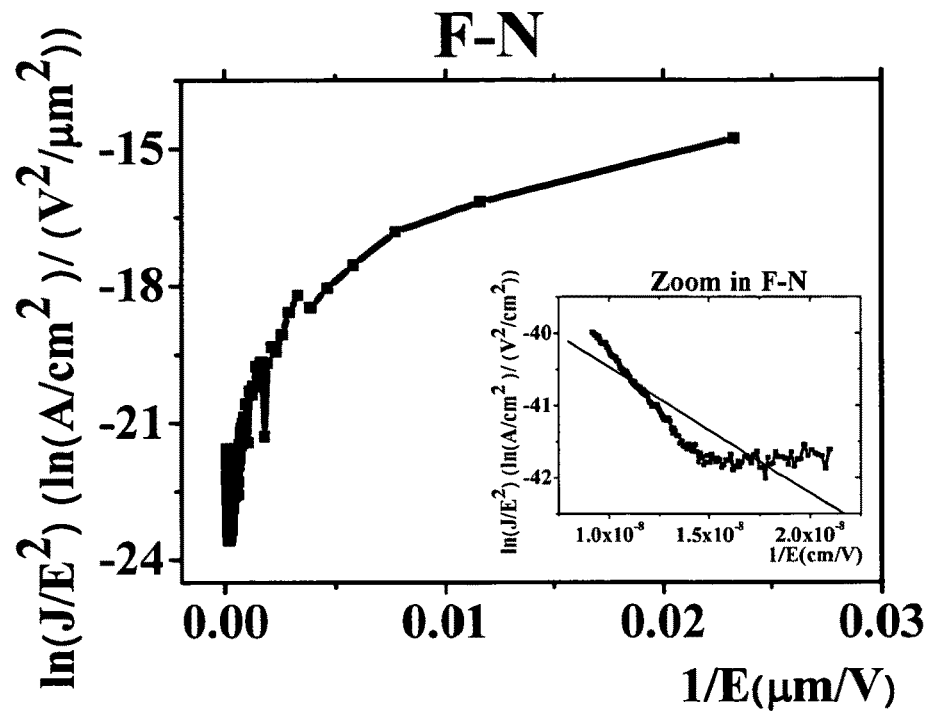
FIG. 10 is an F-N characteristic plot of the field emission of the carbon-84 array prepared according to the embodiment of the present invention when by AFM at 1 atmospheric pressure, in which the field enhancement factor $\beta$ is approximately 4.4.
Figure 11:
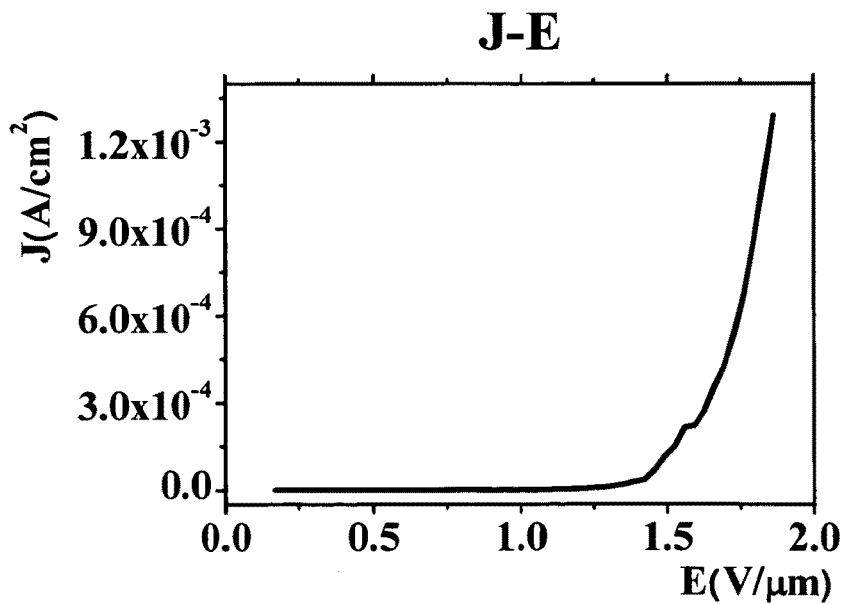
FIG. 11 is a field emission current density versus electric field curve of the carbon-84 array prepared according to the embodiment of the present invention measured at 1 atmospheric pressure, in which the turn-on current density and turn-on electric field are 1 µA/cm$^2$ and 1.12 V/µm, respectively.
Figure 12:
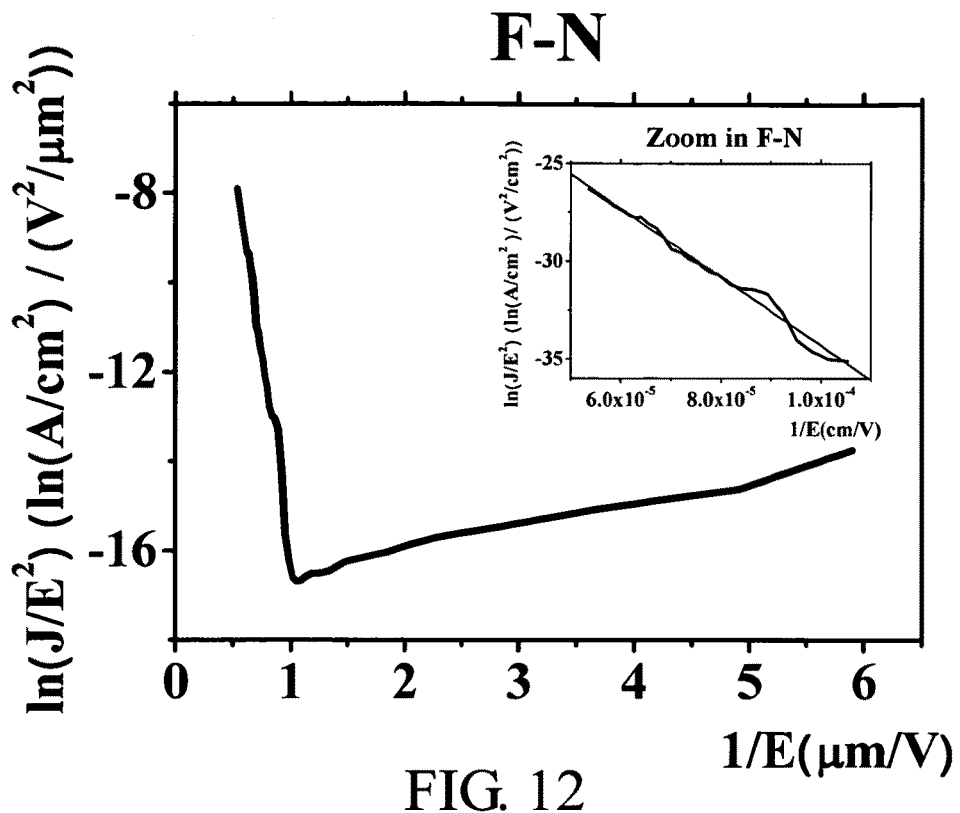
FIG. 12 is an F-N characteristic plot of the field emission of the carbon-84 array prepared according to the embodiment of the present invention measured at 1 atmospheric pressure, in which the field enhancement factor $\beta$ is approximately $4.3 \times 10^3$.

The measured current-voltage characteristic curve of the field emission in vacuum was converted into the F-N characteristic plot in FIG. 8, and the breakdown voltage was measured to be about $4.1 \times 10^6$ V/cm. It shows that the carbon-84 array prepared according to the embodiment of the present invention indeed has excellent high breakdown voltage property.

The method of the present invention is advantageous in that the process is simple and the cost is low, and experiment data prove that the fullerene array prepared according to the method has highly uniform distribution, good field emission property, low turn-on voltage, high energy bandgap and high breakdown voltage, and is capable of avoiding the pore effect of semiconductor carbide products. Therefore, it is very suitable as field emitter in field emission display (FED) or as a substitute for conventional semiconductor carbides. It is believed that the method of the present invention will make important improvement and breakthrough in the application field of FED and semiconductor carbides.

Although the present invention is disclosed as above with preferable embodiments, it is not limited to such; it will be apparent to those skilled in the art that various alternations and modifications can be made without departing from the scope or spirit of the invention. Therefore, the protection scope of the present invention is defined by the scope of the following claims.

We claim:

1. A method of forming a self-assembly fullerene array on the surface of a substrate, comprising:
    (1) providing a substrate selected from the group consisting of silicon (110) and silicon (111);
    (2) pre-annealing the substrate at a temperature ranging from 600° C. to 1200° C. for between 6 to 12 hours in a vacuum system and keeping the substrate at the temperature during fullerene deposition; and
    (3) depositing powdered fullerene nanoparticles on the substrate by a physical vapor deposition method at a temperature ranging from 200° C. to 1200° C. in the vacuum system, thereby embedding the powdered fullerene nanoparticles into the substrate and forming a self-assembly and uniform fullerene array on the substrate.

2. The method according to claim 1, wherein the substrate is one of an n-type or p-type silicon (111) substrate.

3. The method according to claim 1, wherein the vacuum system in Step (2) is a system with a vacuum degree of below about $1 \times 10^{-5}$ Pa.

4. The method according to claim 1, wherein the physical vapor deposition method is an evaporation method.

5. The method according to claim 4, wherein an operation temperature of the evaporation method is in a range of about 550° C. to about 750° C.

6. The method according to claim 4, wherein an operation temperature of the evaporation method is in a range of about 600° C. to about 900° C.

7. The method according to claim 4, wherein an operation temperature of the evaporation method is in a range of about 700° C. to about 1100° C.

8. The method according to claim 1, further comprising pre-cleaning the substrate between Steps (1) and (2), the step of pre-cleaning the substrate including cleaning a surface of the substrate with a solvent and then heating the substrate in a vacuum system to remove an oxide layer and impurities on the surface of the substrate.

9. The method according to claim 8, wherein the solvent is at least one member selected from a group consisting of deionized water, ketones, alcohols, acids, and bases.

10. The method according to claim 1, wherein the fullerene is selected from at least one member selected from a group consisting of carbon-20, carbon-24, carbon-36, carbon-40, carbon-42, carbon-48, carbon-50, carbon-55, carbon-60, carbon-62, carbon-64, carbon-68, carbon-70, carbon-72, carbon-76, carbon-78, carbon-80, carbon-82, carbon-84, carbon-90, carbon-94, carbon-96, carbon-100, carbon-102, carbon-120, carbon-140, carbon-300, single-wall carbon nanotubes, double-wall carbon nanotubes, and multiwall carbon nanotubes.

* * * * *